US011927400B2

(12) United States Patent
Cheng et al.

(10) Patent No.: US 11,927,400 B2
(45) Date of Patent: Mar. 12, 2024

(54) METHOD FOR FABRICATING VAPOR CHAMBER

(71) Applicant: COOLER MASTER CO., LTD., Taipei (TW)

(72) Inventors: Jen-Chih Cheng, Taipei (TW); Lei-Lei Liu, Taipei (TW)

(73) Assignee: COOLER MASTER CO., LTD., Taipei (TW)

( * ) Notice: Subject to any disclaimer, the term of this patent is extended or adjusted under 35 U.S.C. 154(b) by 0 days.

(21) Appl. No.: 18/134,526

(22) Filed: Apr. 13, 2023

(65) Prior Publication Data
US 2023/0251044 A1   Aug. 10, 2023

Related U.S. Application Data

(62) Division of application No. 16/837,125, filed on Apr. 1, 2020, now abandoned.

(30) Foreign Application Priority Data

Jun. 18, 2019  (CN) .......................... 201910528348.0

(51) Int. Cl.
| F28D 15/02 | (2006.01) |
| F28D 15/04 | (2006.01) |
| F28F 3/12  | (2006.01) |
| H05K 7/20  | (2006.01) |

(52) U.S. Cl.
CPC ..... *F28D 15/0283* (2013.01); *F28D 15/0233* (2013.01); *F28D 15/046* (2013.01); *F28F 3/12* (2013.01); *H05K 7/20309* (2013.01); *F28F 2240/00* (2013.01)

(58) Field of Classification Search
CPC ............. F28D 15/0283; F28D 15/0233; F28D 15/046; F28D 15/0258; F28D 15/04
See application file for complete search history.

(56) References Cited

U.S. PATENT DOCUMENTS

2009/0260785 A1* 10/2009 Wang .................... F28D 15/046
                                                                165/170
2018/0202723 A1*  7/2018 Huang .................. H01L 23/427

FOREIGN PATENT DOCUMENTS

WO    WO-2018198353 A1 * 11/2018 ......... F28D 15/0233

OTHER PUBLICATIONS

English translation WO2018198353 (Year: 2018).*

* cited by examiner

*Primary Examiner* — Jason L Vaughan
*Assistant Examiner* — Amanda Kreiling
(74) *Attorney, Agent, or Firm* — Maschoff Brennan (57) ABSTRACT

This disclosure relates to a method for fabricating a vapor chamber. The method includes positioning a capillary structure on a first cover, forming an accommodation space, a flow channel, and a plurality of posts on a first surface of a second cover, covering the first cover with the second cover, positioning the first cover and the second cover such that the plurality of posts are spaced apart from the capillary structure by a distance, and pressure welding the first cover and the second cover so as to form a chamber between the first cover and second cover and a passage connected to the chamber and to pressure weld the plurality of posts with the capillary structure.

21 Claims, 12 Drawing Sheets

METHOD FOR FABRICATING VAPOR CHAMBER

CROSS-REFERENCE TO RELATED APPLICATIONS

This patent application is a divisional patent application of U.S. patent application Ser. No. 16/837,125 filed on Apr. 1, 2020 and entitled "VAPOR CHAMBER AND METHOD FOR FABRICATING THE SAME", which is a non-provisional application claims priority under 35 U.S.C. § 119(a) on Patent Application No(s). 201910528348.0 filed in China, P.R.C. on Jun. 18, 2019, the entire contents of which are hereby incorporated by reference.

TECHNICAL FIELD

The present disclosure relates to a method for fabricating the vapor chamber, more particularly to a method for fabricating the vapor chamber.

BACKGROUND

A vapor chamber and a heat pipe can be applied to dissipate heat. Thermal conduction of a heat pipe occurs in one dimension while thermal conduction of a vapor chamber occurs in two dimensions. Therefore, the vapor chamber is a more effective heat dissipation device to dissipate heat generated by a heat source in an electronic product. Generally, the vapor chamber includes a main body and a capillary structure, the main body has a chamber that can accommodate working fluid, and the capillary structure is disposed in the chamber. The main body can be divided into two parts—an evaporation part and a condensation part. The working fluid absorbs heat and will be vaporized to gaseous form in the evaporation part, the working fluid in gaseous form diffuses into the condensation part and will be condensed into liquid state and then returns to the evaporation part via the capillary structure and thus forming a cooling cycle of the working fluid.

However, with the increasing demand for lightweight and small electronic products, the internal space for accommodating electrical components is very limited. Therefore, how to develop a vapor chamber that can catch up the trend is an important topic in the field. Conventionally, the main body of the vapor chamber is too thin to have a sufficient structural strength. The vapor chamber is often heated over 90° C., and the high temperature will evaporate most of the working fluid and thus increasing the internal pressure of the vapor chamber to exceed a limit. By that time, the vapor chamber will be deformed or even cracked by the internal pressure. To prevent this, some put support posts in the chamber to reinforce the structural strength of the vapor chamber. And the posts also can enhance the heat conduction of the vapor chamber. However, the vapor chamber with the supporting posts is easily cracked during the manufacturing process.

SUMMARY

The present disclosure provides a method for fabricating the vapor chamber that are able to improve the fabrication quality and heat transfer of the vapor chamber.

According to one aspect of the present disclosure, a method for fabricating a vapor chamber includes the following steps. Positioning a capillary structure on a first cover. Forming an accommodation space, a flow channel, and a plurality of posts on a first surface of a second cover. Covering the first cover with the second cover. Positioning the first cover and the second cover such that the plurality of posts are spaced apart from the capillary structure by a distance. Pressure welding the first cover and the second cover so as to form a chamber between the first cover and second cover and a passage connected to the chamber and to pressure weld the plurality of posts with the capillary structure.

According to the method for fabricating the vapor chamber discussed above, the plurality of posts are pressure welded to the capillary structure such that the heat can be conducted not only via the capillary structure but also via the posts, thereby enhancing the heat conduction of the vapor chamber.

Furthermore, the pressure welding can be performed at a certain temperature and pressure so as to ensure that the posts to be fully pressure welded to the capillary structure and can accurately control the change in thickness of the posts. Therefore, the vapor chamber is prevented from being cracked during pressure welding and thus enhancing the fabrication quality of the vapor chamber.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
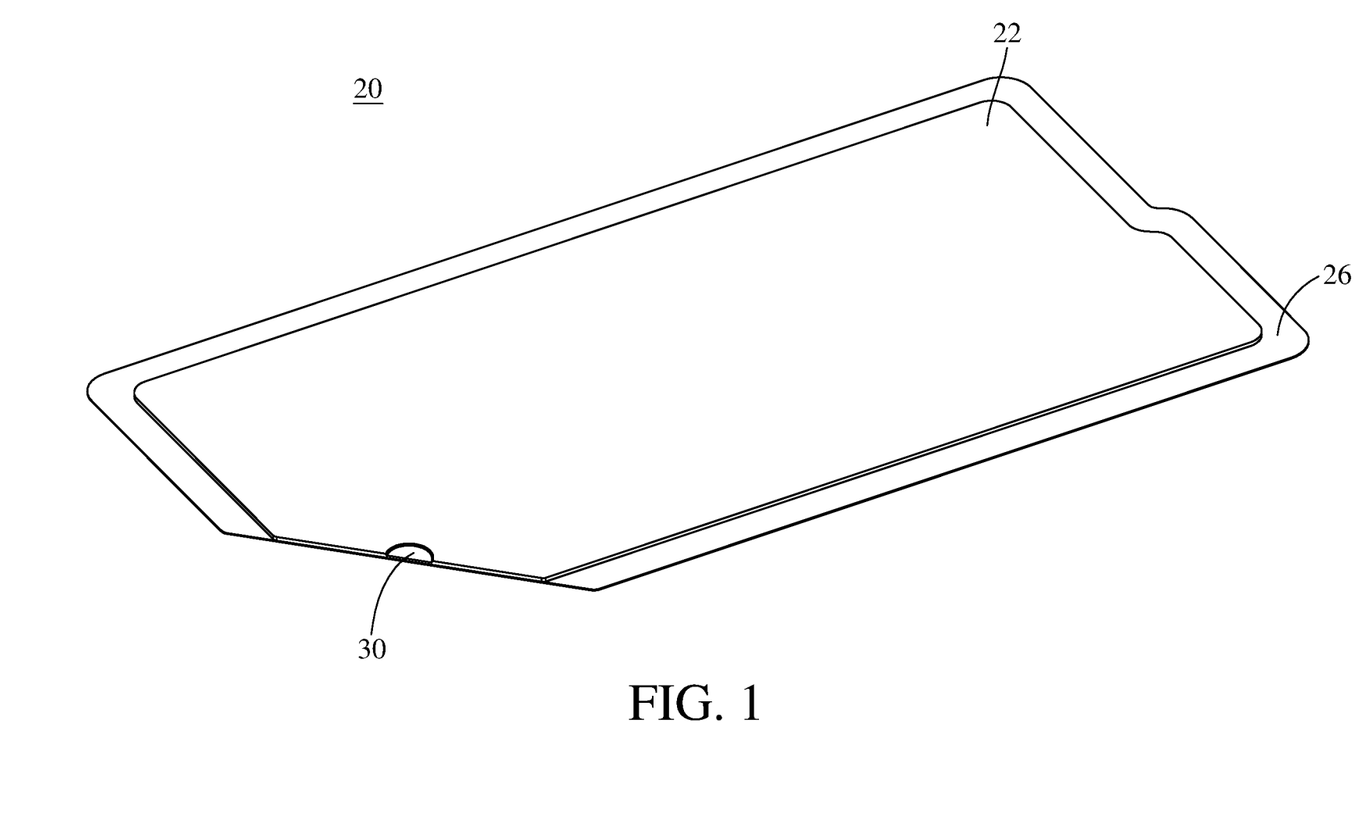
FIG. 1 is a perspective view of a vapor chamber according to a first embodiment of the present disclosure.
Figure 2:
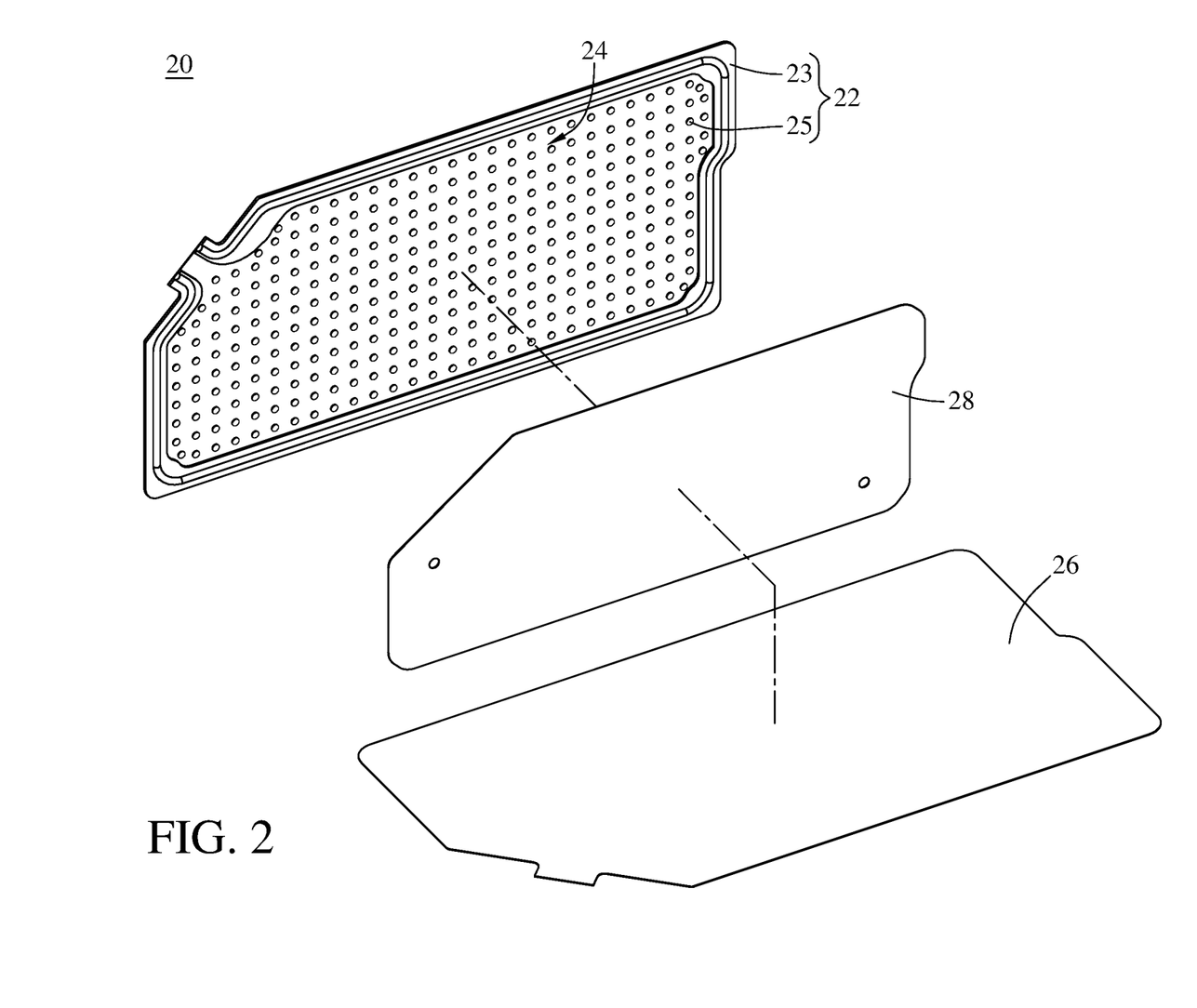
FIG. 2 is an exploded view of the vapor chamber in FIG. 1.
Figure 3:
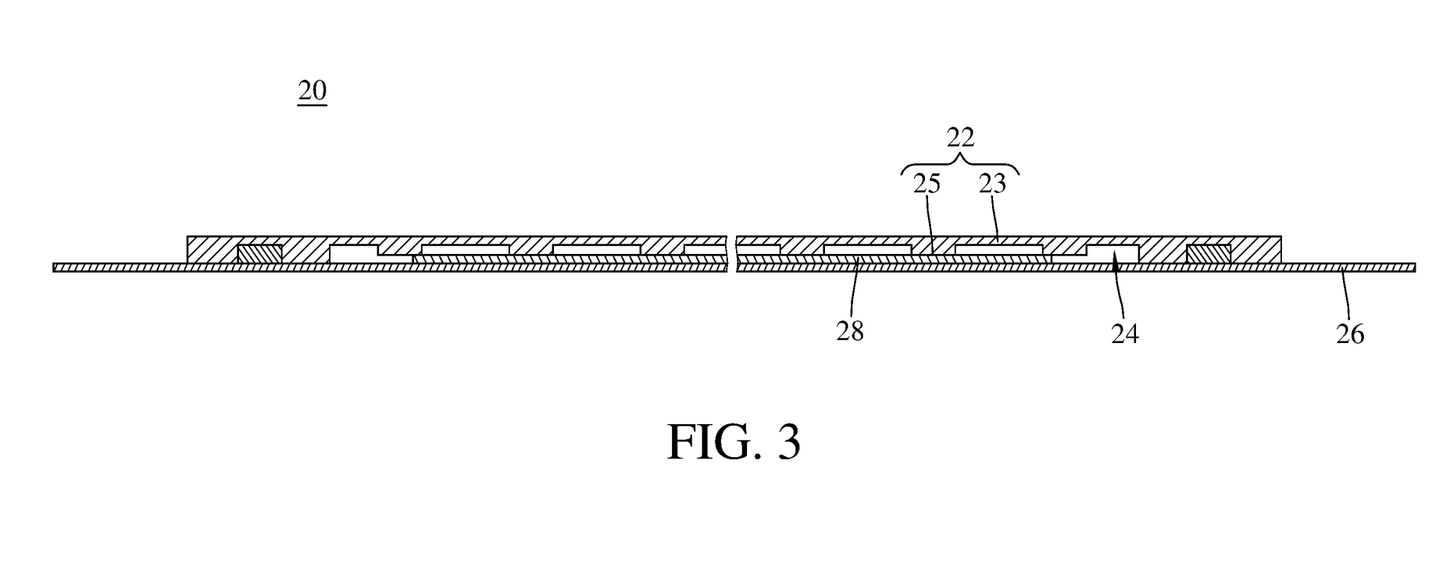
FIG. 3 is a cross-sectional view of the vapor chamber in FIG. 1.

Please refer to FIG. 1 to FIG. 3, which FIG. 1 is a perspective view of a vapor chamber according to a first embodiment of the present disclosure, FIG. 2 is an exploded view of the vapor chamber in FIG. 1, and FIG. 3 is a cross-sectional view of the vapor chamber in FIG. 1.

This embodiment provides a vapor chamber 20. The vapor chamber 20 is, for example, in a thin-plate shape and has a thickness of, for example, less than 0.5 millimeters. The vapor chamber 20 includes an upper cover 22, a lower cover 26, and a capillary structure 28.

The upper cover 22 and the lower cover 26 may be made of oxygen-free copper, copper alloy containing silicon, or copper alloy plate containing aluminum. The upper cover 22 includes a cover part 23 and a plurality of posts 25. The cover part 23 has an accommodation space 24. The posts 25 are located in the accommodation space 24 and protrude from the cover part 23. The lower cover 26 and the cover part 23 of the upper cover 22 are in contact with each other by pressure welding so as to form a chamber S therebetween, wherein the pressure welding includes, for example, resistance-welding, friction welding, cold welding, and diffusion bonding. The capillary structure 28 is, for example, copper mesh or copper fiber paper and is located in the chamber S. Further, one end of each post 25 is pressure welded to the capillary structure 28, which is disposed on the lower cover 26, such that the posts 25 are able to reinforce the structural strength of the vapor chamber 20. Furthermore, there is a sealing structure 30 located at an edge of the vapor chamber 20 for preventing working fluid from leaking from the chamber S. The sealing structure 30 is formed by pressure welding. The processes of fabricating the vapor chamber 20 are described below.

Please refer to FIG. 4 to FIG. 13, which shows a fabricating process of the vapor chamber in FIG. 1.

Figure 4:
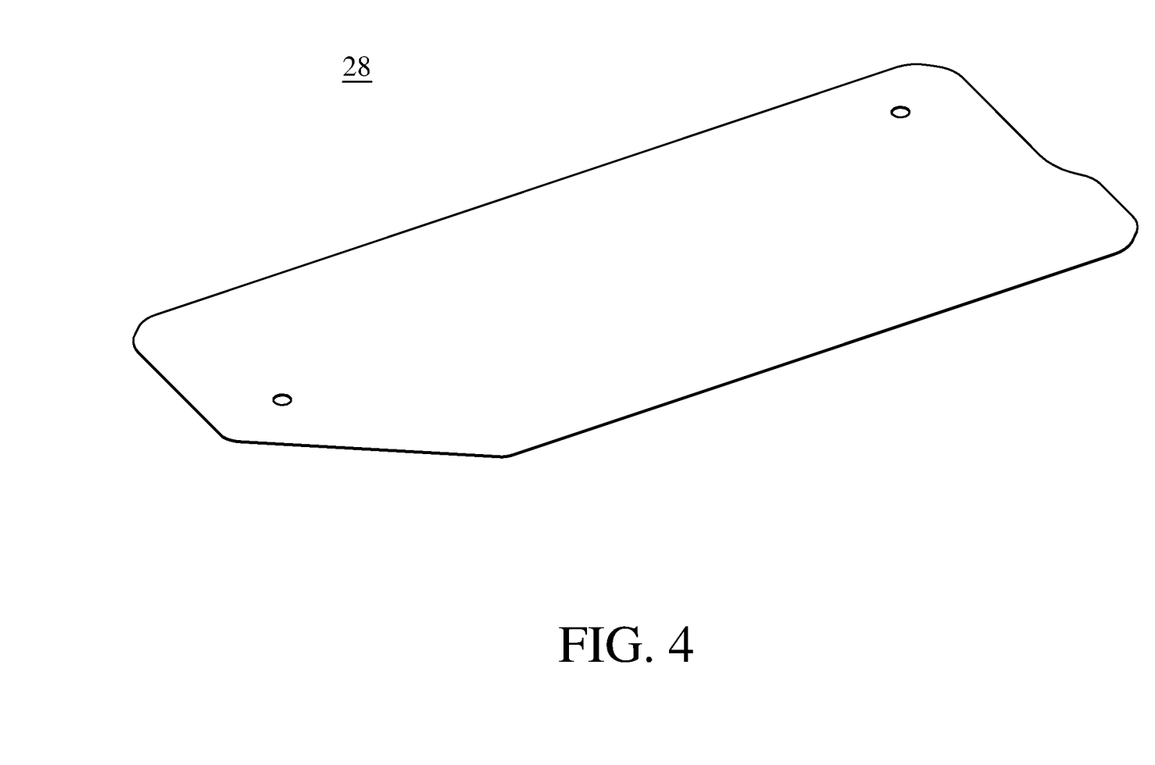
FIG. 4 to FIG. 13 shows a fabricating process of the vapor chamber in FIG. 1.

As shown in FIG. 4, first is to cut a capillary structure 28 to make it fit an accommodation space 230 of the second cover 200. And then is to anneal the capillary structure 28.

Figure 5:
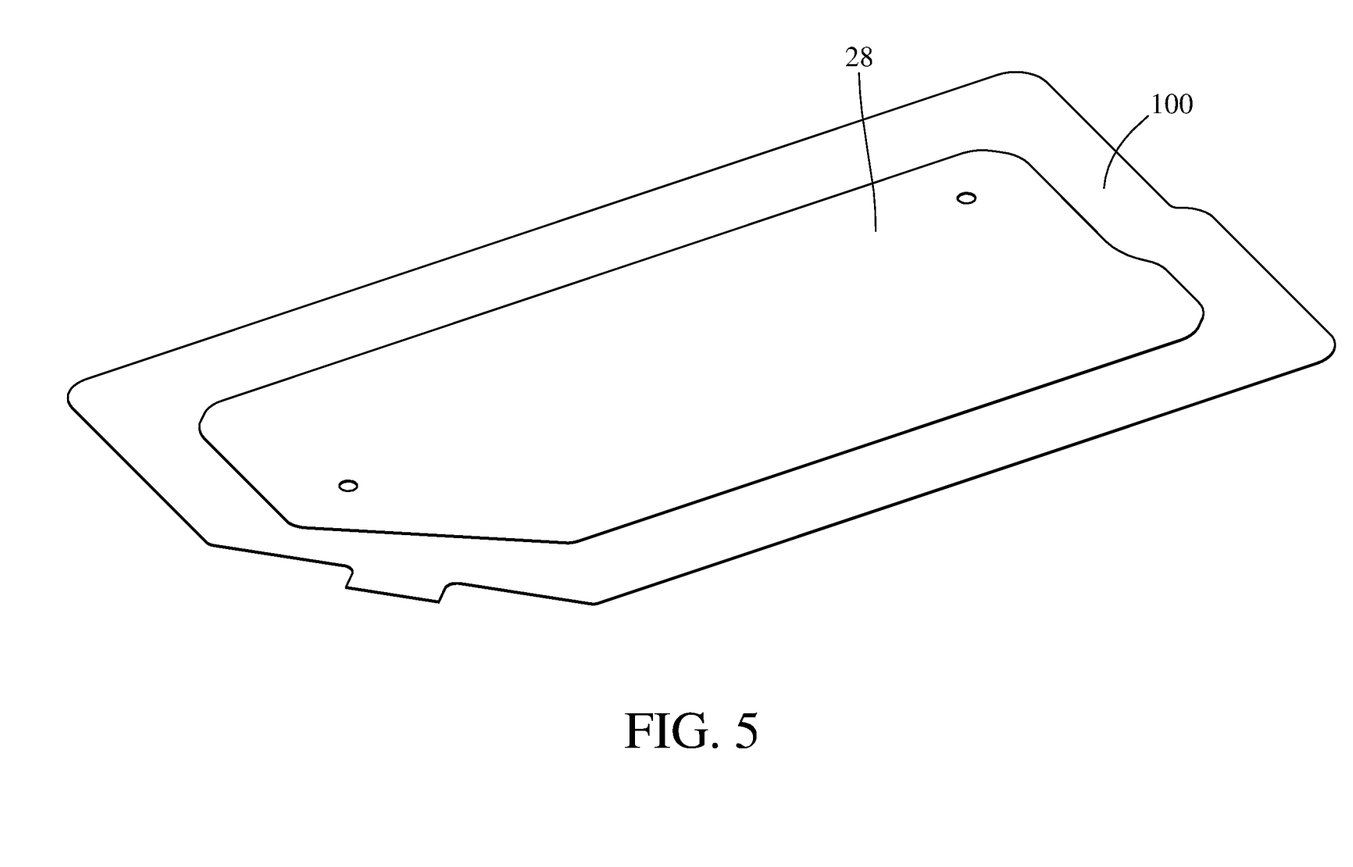

Then, as shown in FIG. 5, the capillary structure 28 is positioned and pressure welded on a first cover 100 where the first cover 100 is in a plate shape.

Figure 6:
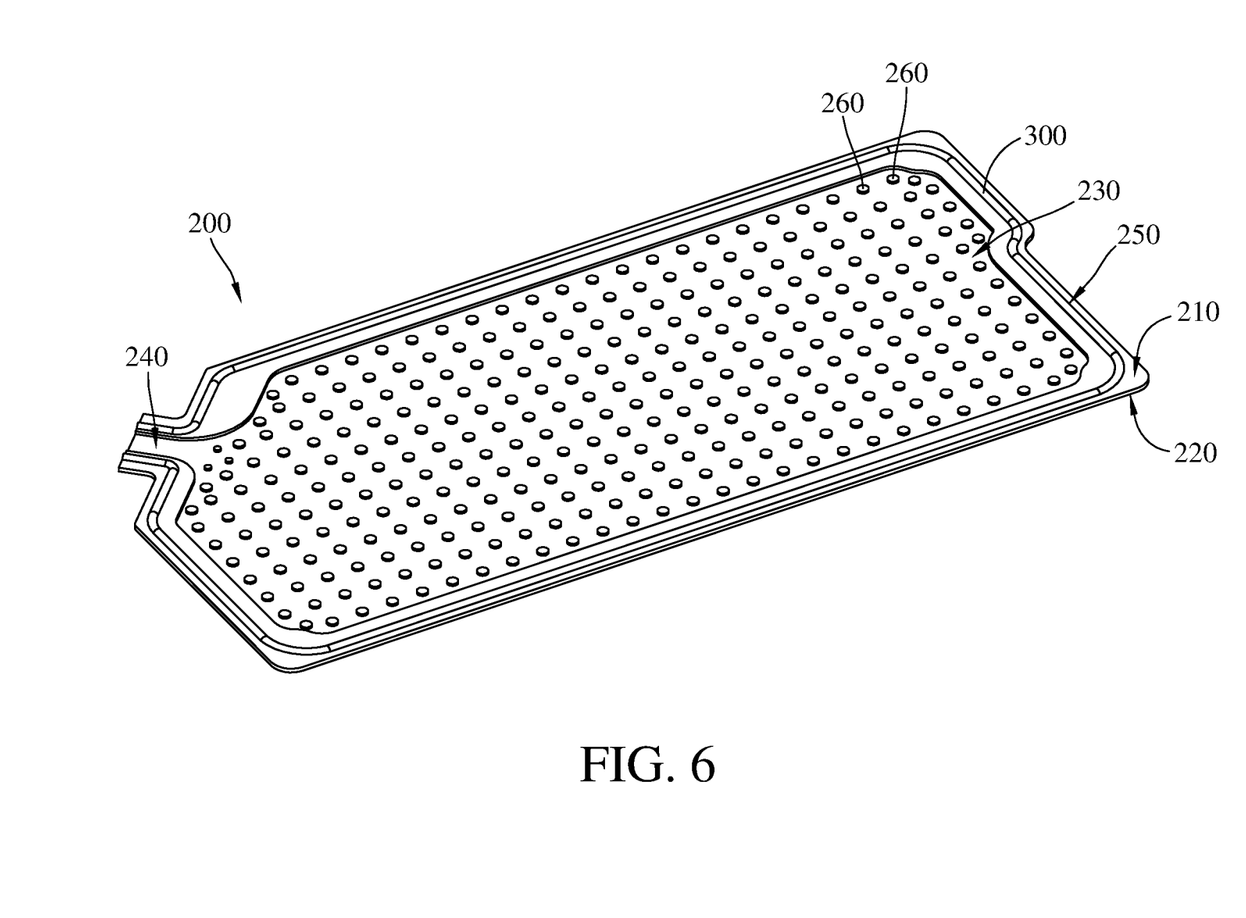

Then, as shown in FIG. 6, a second cover 200 is provided. The second cover 200 has a first surface 210, a second surface 220, an accommodation space 230, a flow channel 240, a groove 250, and a plurality of posts 260. The first surface 210 and the second surface 220 are opposite to each other. The accommodation space 230, the flow channel 240, the groove 250, and the plurality of posts 260 are formed on the first surface 210 by, for example, etching, sand blasting, or stamping process. The accommodation space 230, the flow channel 240, the groove 250, and the plurality of posts 260 may be formed by the same or different etching, sand blasting, or stamping processes. The groove 250 is formed along the contour of the edge of the second cover 200. Then, a solder 300 is injected into the groove 250. The solder 300 is, for example, a cooper paste, tin paste, or similar substance.

Figure 7:
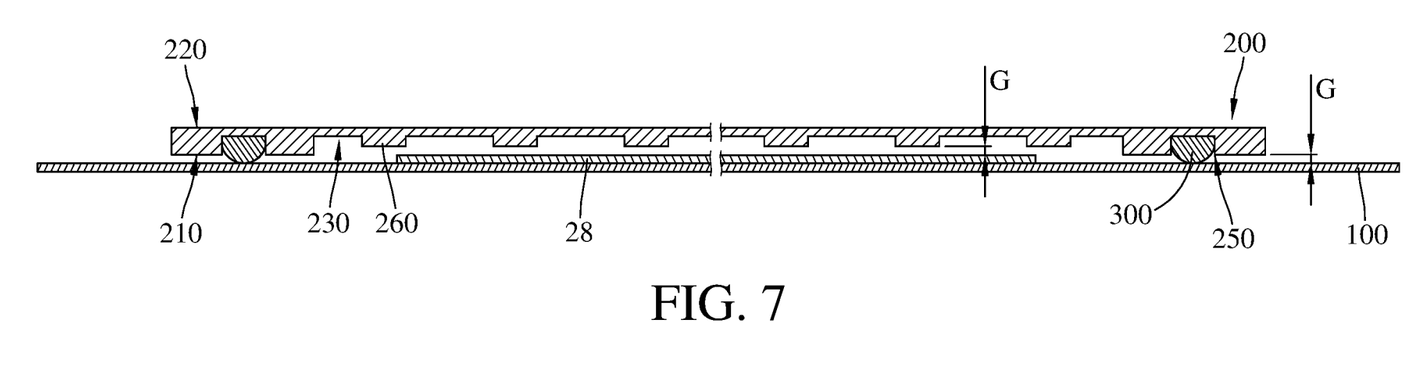

Then, as shown in FIG. 7, the first cover 100 is covered by the second cover 200, and the second cover 200 is positioned on the first cover 100. In detail, the second cover 200 is stacked on the first cover 100 with the solder 300 in between.

Figure 8:
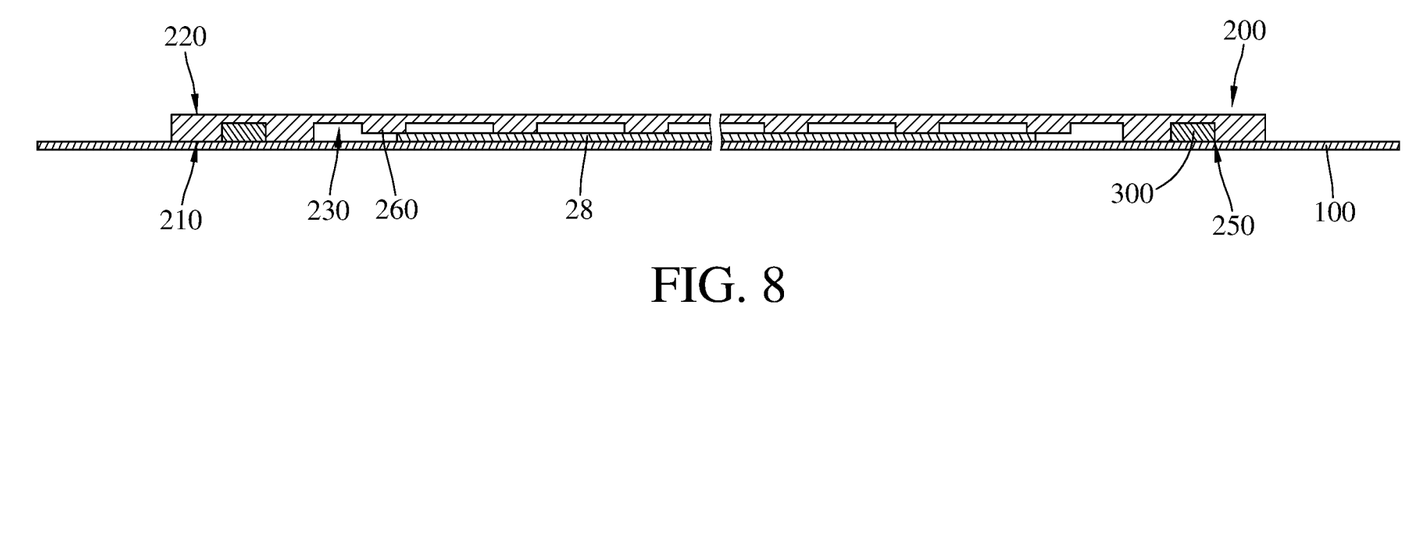
Figure 9:
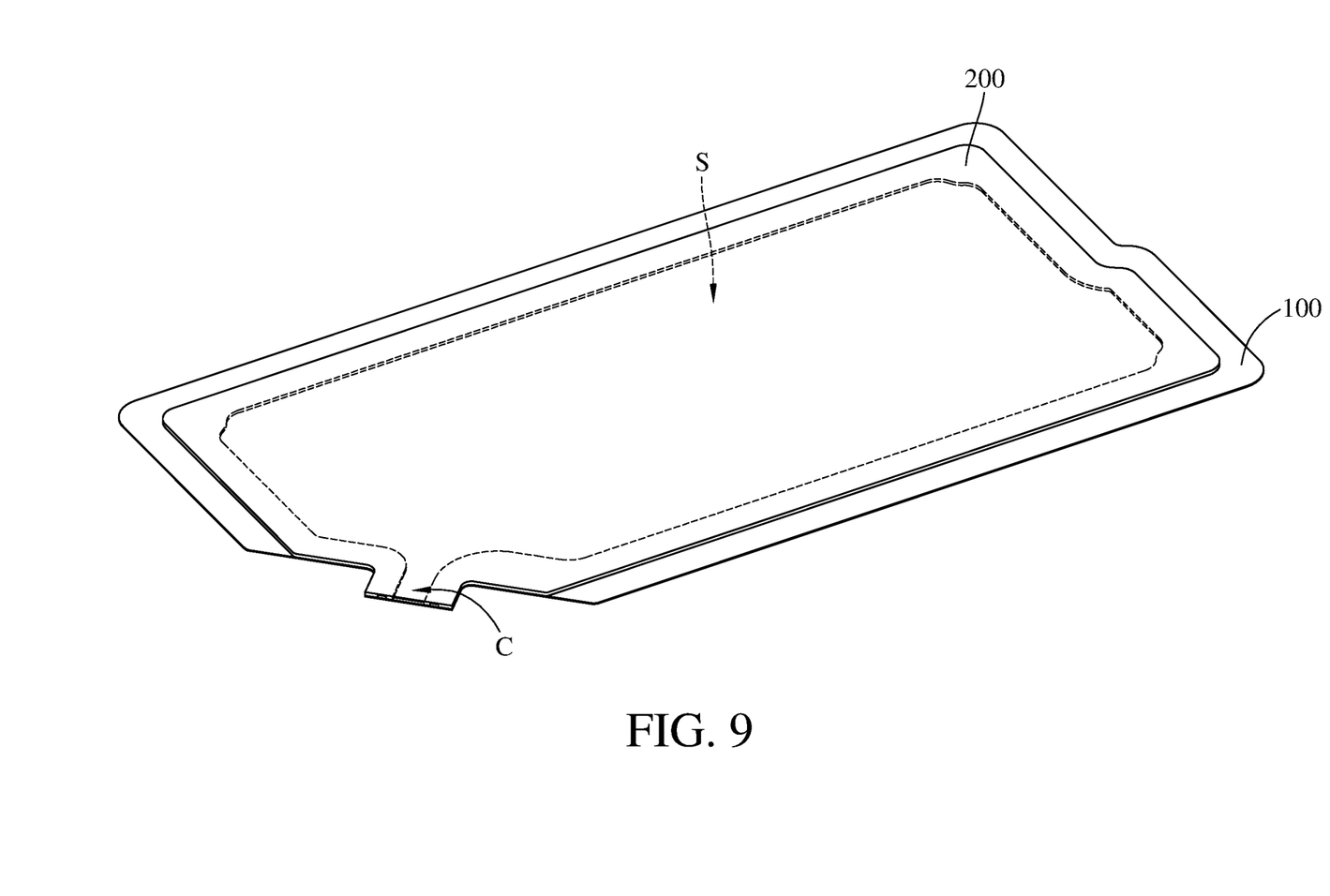

Then, as shown in FIG. 8 and FIG. 9, the first cover 100 is pressure welded to the first surface 210 of the second cover 200, meanwhile, the posts 260 are also pressure welded to the capillary structure 28. By doing so, the first cover 100 and the second cover 200 are in contact with each other and form a chamber S therebetween and a passage C connected to the chamber S, and the capillary structure 28 is located between and in direct contact with the posts 260 and the first cover 100 at the same time; in such a case, the posts 260 are able to maintain the gap between the capillary structure 28 and the second cover 200. That is, the posts 260 are able to reinforce the structural strength of the first cover 100 and the second cover 200.

The first cover 100 and the second cover 200 are very thin, such that, if the pressure welding was not performed under some specific conditions, the first cover 100 and the second cover 200 may be cracked and the posts 260 may not be fully pressure welded to the capillary structure 28. In detail, if the first cover 100 and the second cover 200 have a too small change in thickness during the pressure welding or if the chamber S is expanded outward by a large external force, the posts 260 may not be fully pressure welded to the capillary structure 28. In such a case, the posts 260 will not be able to perfectly maintain the gap between the first cover 100 and the second cover 200. On the contrary, if the pressure welding is not properly controlled to cause a large change in thickness of the first cover 100 and the second cover 200, the first cover 100 and the second cover 200 may experience too large stress and got penetrated or damage by the posts 260.

Therefore, in order to improve the quality of the pressure welding, in this embodiment, some conditions are given below:

| | Factor | | | | | |
|---|---|---|---|---|---|---|
| | | | Time (s) | | | Change in |
| Parameter | Temperature (° C.) | Pressure (kg/cm²) | First period | Second period | Third period | thickness (mm) |
| Parameters Set 1 | 680 | 25 | 300 | 240 | 180 | 0.030 |
| Parameters Set 2 | 700 | 20 | 260 | 220 | 180 | 0.030 |
| Parameters Set 3 | 750 | 18 | 260 | 220 | 180 | 0.030 |
| Parameters Set 4 | 800 | 15 | 220 | 200 | 240 | 0.030 |
| Parameters Set 5 | 850 | 10 | 220 | 200 | 240 | 0.030 |

Assume that a predetermined change in thickness is 0.03 mm, the change in thickness refers to the amount of compressing a post 260 which has been heated. In parameters set 1, the pressure welding is performed at a temperature of 680° C. and at a pressure of 25 kg/cm². In parameters set 2, the pressure welding is performed at a temperature of 700° C. and at a pressure of 20 kg/cm². In parameters set 3, the pressure welding is performed at a temperature of 750° C. and at a pressure of 18 kg/cm². In parameters set 4, the pressure welding is performed at a temperature of 800° C. and at a pressure of 15 kg/cm². In parameters set 5, the pressure welding is performed at a temperature of 850° C. and at a pressure of 10 kg/cm².

It is noted that the parameters sets 1 to 5 are exemplary and the disclosure is not limited thereto. In some other embodiments, the pressure welding can be performed at a temperature and pressure by referring to different parameters. For example, the pressure welding can be performed at a temperature of 680° C. (shown in parameters set 1) and a pressure of 18 kg/cm² (shown in parameters set 3) or a pressure of 10 kg/cm² (shown in parameters set 5). Alternatively, the pressure welding can be performed at a pressure of 10 kg/cm² (shown in parameters set 5) and a temperature of 680° C. (shown in parameters set 1) or a temperature of 800° C. (shown in parameters set 4).

The predetermined change of 0.03 mm in thickness is also exemplary and the disclosure is either not limited thereto. In some other embodiments, the change in thickness of the first cover 100 and the second cover 200 can be altered according to different requirements.

In addition, in the above table, the first period refers to the duration which the pressure welding is performed at a constant temperature, the second period refers to the duration which the pressure welding is performed at a constant pressure and decreasing temperature, and the third period refers to the duration which the pressure welding is performed at a decreasing temperature and pressure. For example, in the first period, the pressure welding is performed at a temperature of 680° C. and a pressure of 25 kg/cm$^2$, wherein the 680° C. must be constant for 300 seconds. Then, in the second period, the pressure is fixed but the temperature is decreased down to a range between 300° C. and 400° C. And then, the third period is performed after the second period.

Figure 10:
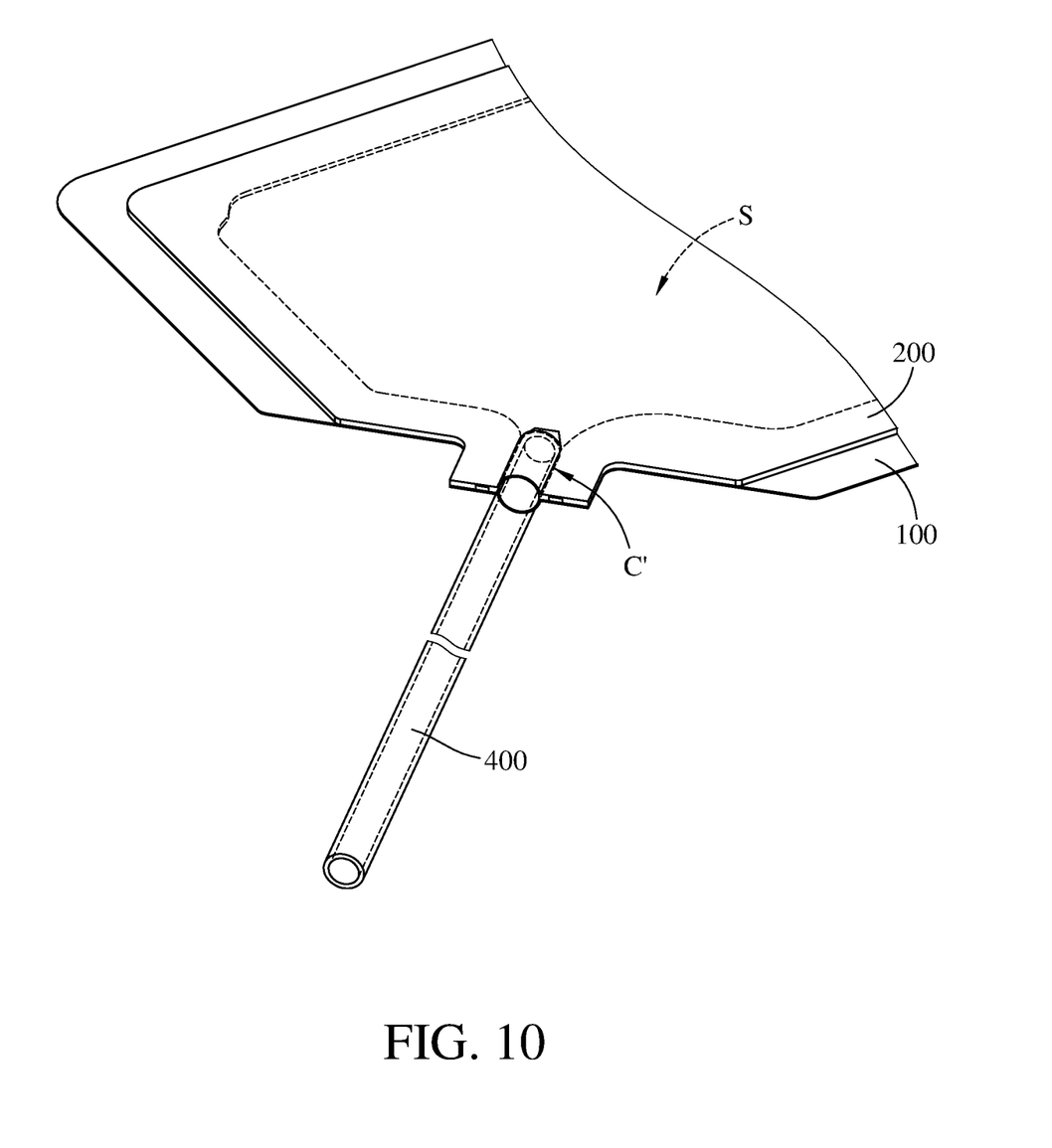

Then, the aperture size of the passage C is enlarged. As shown in FIG. 10, the passage C has been enlarged to a passage C', and then a degassing tube 400 is inserted into the passage C'. Part of volume of the degassing tube 400 can be removed by, for example, turning process, or the degassing tube 400 can be partially deformed to a smaller volume by, for example, a pressing process, such that the degassing tube 400 can be easily inserted into the passage C'. And then the part of the degassing tube 400 that is inserted into the passage C' is pressure welded to the first cover 100 and the second cover 200 by the solder 300.

Preferably, a leak detection process may be performed on the degassing tube 400, the first cover 100, and the second cover 200, after they had been pressure welded together, in order to ensure the quality of pressure welding. In addition, an annealing process may be performed on the degassing tube 400, the first cover 100, and the second cover 200, after they had been pressure welded together, in order to release the stress caused by the pressure welding process and to enhance their mechanical reliability.

Then, the degassing tube 400 can be connected to a degassing equipment for drawing gas from the chamber S, and then the degassing tube 400 can be connected to an injecting equipment for injecting working fluid into the chamber S.

Figure 11:
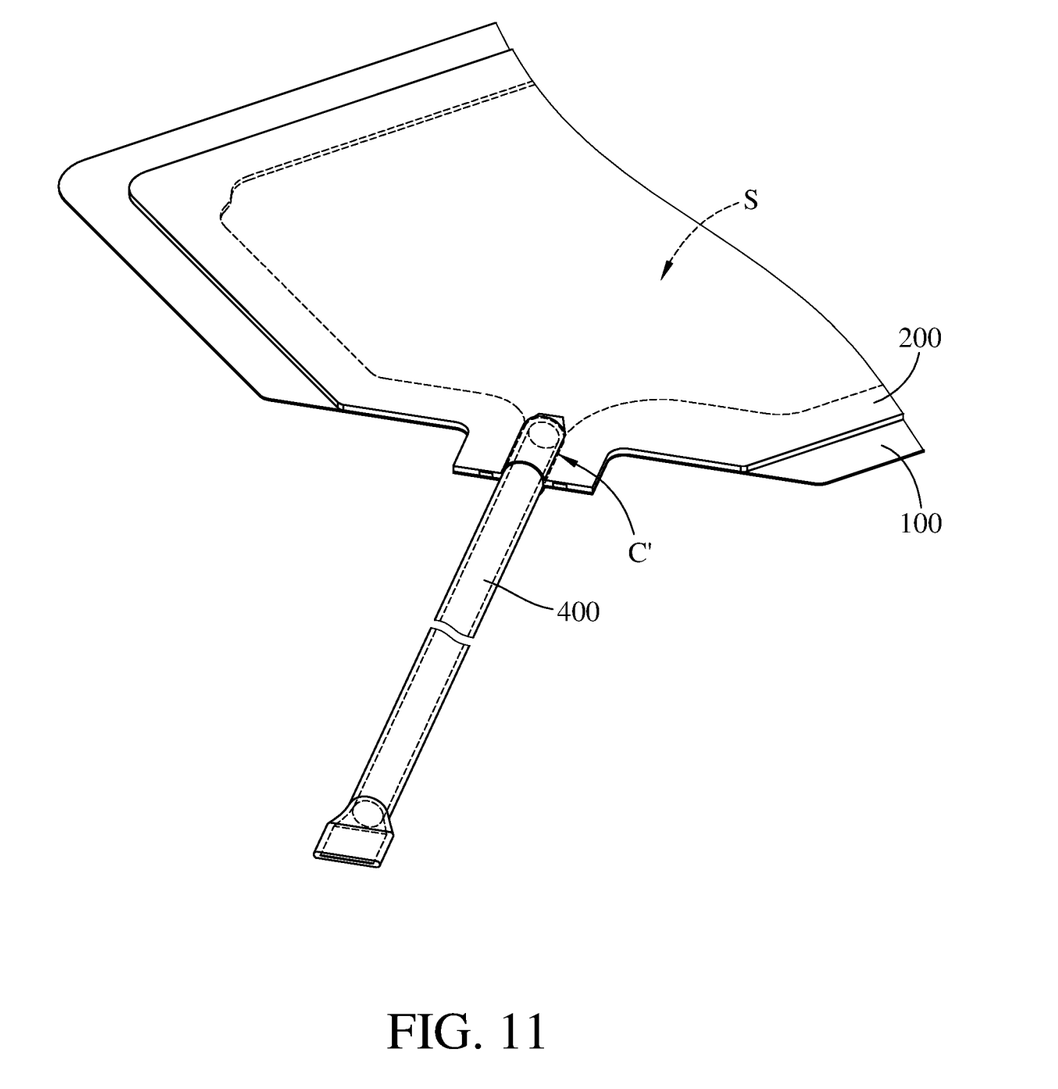

Then, as shown in FIG. 11, another part of the degassing tube 400 which is outside the passage C' is squeezed by a stamping process and then the squeezed part of the degassing tube 400 is sealed by a pressure welding process, such that the working fluid is prevented from leaking from the chamber S and the low pressure in the chamber S is secured.

Figure 12:
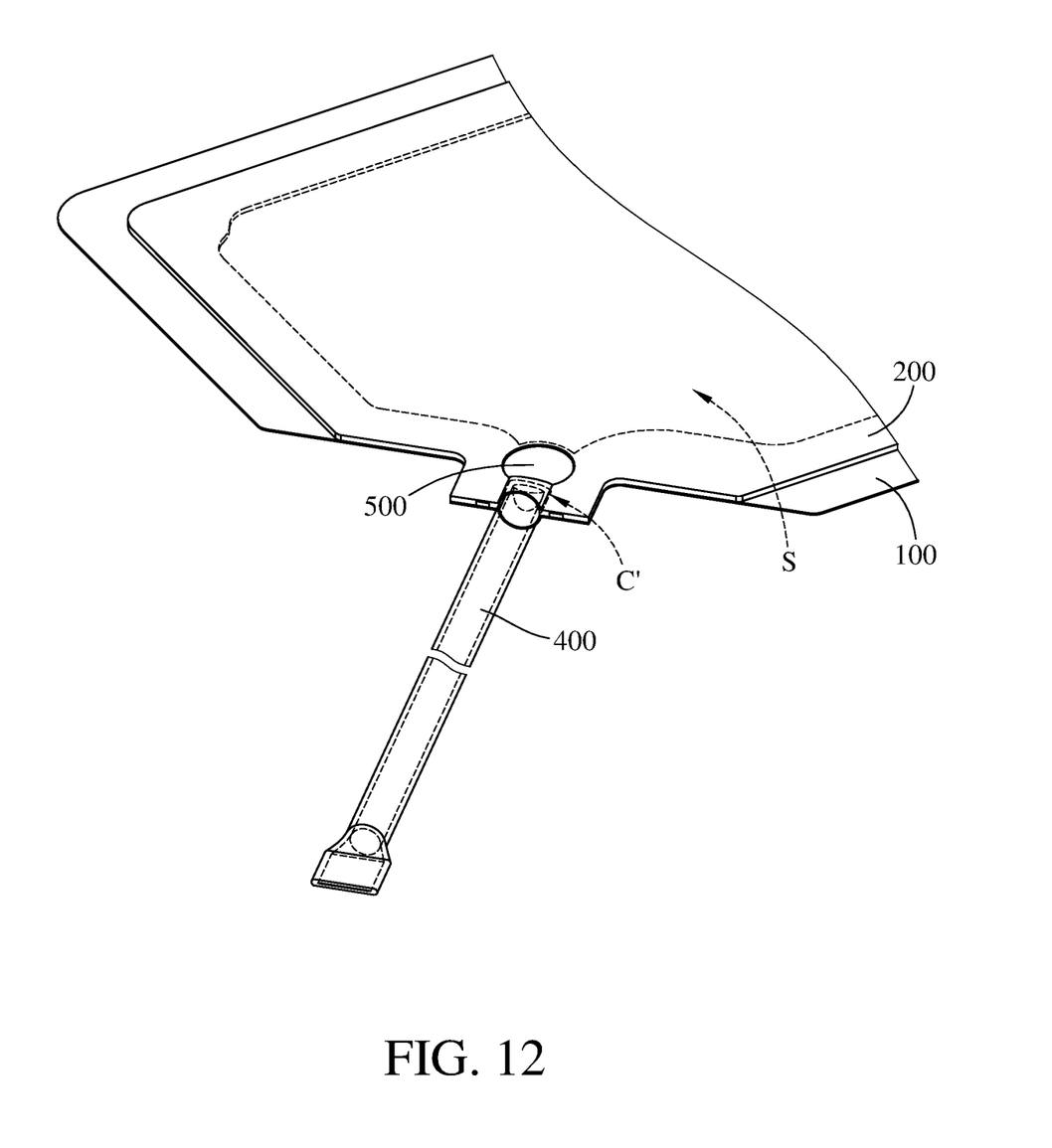

Then, as shown in FIG. 12, a joint between the chamber S and the passage C' is pressure welded so as to form a depressed structure 500 to seal the chamber S.

Figure 13:
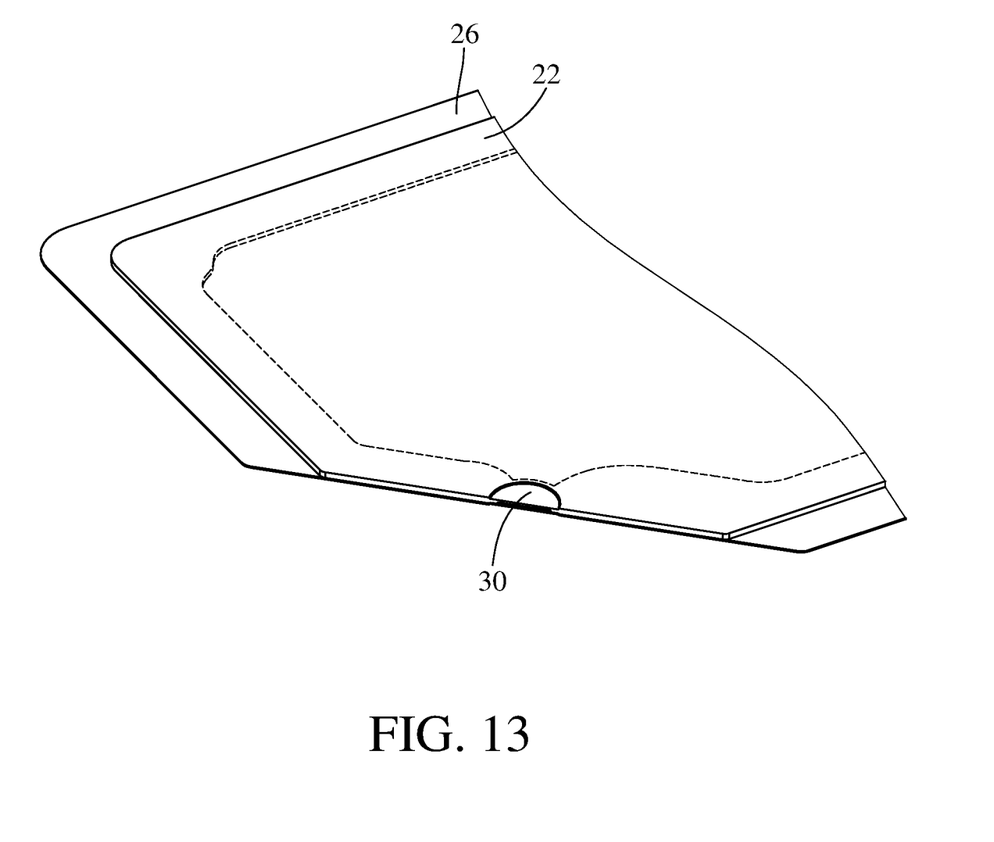

Then, as shown in FIG. 13, part of the depressed structure 500 is cut off so that part of the first cover 100 (shown in FIG. 12) and the second cover (shown in FIG. 12) where the passage C' are disposed are also cut off. By the above steps, the vapor chamber 20 is completed. The remained part of the first cover 100 is the lower cover 26 of the vapor chamber 20, and the remained part of the second cover 200 is the upper cover 22 of the vapor chamber 20.

According to the method for fabricating the vapor chamber discussed above, the plurality of posts are pressure welded to the capillary structure, such that the heat can be conducted not only via the capillary structure but also via the posts, thereby enhancing the heat conduction of the vapor chamber.

Furthermore, the pressure welding performed under the conditions provided above can ensure that the posts to be fully pressure welded to the capillary structure and can accurately control the change in thickness of the posts. Therefore, the vapor chamber is prevented from being cracked during pressure welding and thus enhancing the fabrication quality of the vapor chamber.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. A method for fabricating a vapor chamber, comprising:
positioning a capillary structure on a first cover;
forming an accommodation space, a flow channel, and a plurality of posts on a first surface of a second cover;
covering the first cover with the second cover;
positioning the first cover and the second cover such that the plurality of posts are spaced apart from the capillary structure by a distance; and
pressure welding the first cover and the second cover so as to form a chamber between the first cover and second cover and a passage connected to the chamber and to pressure weld the plurality of posts with the capillary structure.

2. The method according to claim 1, wherein the pressure welding is performed at a temperature ranging between 680° C. and 850° C.

3. The method according to claim 1, wherein the pressure welding is performed at a pressure ranging between 10 kg/cm$^2$ and 25 kg/cm$^2$.

4. The method according to claim 2, wherein the pressure welding is performed at a pressure ranging between 10 kg/cm$^2$ and 25 kg/cm$^2$.

5. The method according to claim 1, wherein the pressure welding is performed at a temperature ranging between 680° C. and 750° C. and is performed at a pressure ranging between 18 kg/cm$^2$ and 25 kg/cm$^2$.

6. The method according to claim 1, wherein the pressure welding is performed at a temperature ranging between 750° C. and 850° C., and is performed at a pressure ranging between 10 kg/cm$^2$ and 18 kg/cm$^2$.

7. The method according to claim 1, wherein the pressure welding is performed at a temperature of 680° C. and a pressure of 25 kg/cm$^2$.

8. The method according to claim 1, wherein the pressure welding is performed at a temperature of 700° C. and a pressure of 20 kg/cm$^2$.

9. The method according to claim 1, wherein the pressure welding is performed at a temperature of 750° C. and a pressure of 18 kg/cm$^2$.

10. The method according to claim 1, wherein the pressure welding is performed at a temperature of 800° C. and a pressure of 15 kg/cm$^2$.

11. The method according to claim 1, wherein the pressure welding is performed at a temperature of 850° C. and a pressure of 10 kg/cm$^2$.

12. The method according to claim 1, wherein the first cover and the second cover have a change in thickness between 0.015 millimeters and 0.045 millimeters during the pressure welding.

13. The method according to claim 1, wherein the first cover and the second cover have a change of 0.03 millimeters in thickness during the pressure welding.

14. The method according to claim 1, before positioning the capillary structure on the first cover, further comprising:
    cutting a capillary structure to fit the accommodation space of the second cover; and
    annealing the capillary structure.

15. The method according to claim 1, before pressure welding the first cover and the second cover, further comprising:
    forming a groove on the first surface of the second cover; and
    injecting a solder into the groove.

16. The method according to claim 1, after pressure welding the first cover and the second cover, further comprising:
    enlarging an aperture size of the passage; and
    inserting a degassing tube into the passage which has been enlarged.

17. The method according to claim 16, after inserting the degassing tube into the passage, further comprising:
    drawing gas and filling working fluid via the degassing tube.

18. The method according to claim 17, after drawing gas and filling working fluid via the degassing tube, further comprising:
    squeezing part of the degassing tube which is outside the passage; and
    sealing the part of the degassing tube, which has been squeezed, by pressure welding.

19. The method according to claim 18, after sealing the part of the degassing tube by pressure welding, further comprising:
    pressure welding a joint between the chamber and the passage so as to form a depressed structure to seal the chamber.

20. The method according to claim 19, after sealing the part of the degassing tube by pressure welding, further comprising:
    cutting the depressed structure.

21. The method according to claim 1, wherein the accommodation space, the flow channel, and the plurality of posts are formed by an etching process or a stamping process.

* * * * *